(12) United States Patent
Oron et al.

(10) Patent No.: US 7,557,977 B2
(45) Date of Patent: Jul. 7, 2009

(54) LASER PULSE GENERATOR

(76) Inventors: Ram Oron, 18 Chen Boulevard, Rehovot 76469 (IL); Moshe Oron, 26 Busel Street, Rehovot, 76469 (IL)

( * ) Notice: Subject to any disclaimer, the term of this patent is extended or adjusted under 35 U.S.C. 154(b) by 328 days.

(21) Appl. No.: 10/558,988

(22) PCT Filed: Jun. 1, 2004

(86) PCT No.: PCT/IB2004/001889

§ 371 (c)(1), (2), (4) Date: Dec. 1, 2005

(87) PCT Pub. No.: WO2004/107510

PCT Pub. Date: Dec. 9, 2004

(65) Prior Publication Data

US 2007/0053391 A1 Mar. 8, 2007

(51) Int. Cl.
G02F 1/00 (2006.01)
G02F 1/01 (2006.01)
(52) U.S. Cl. ...................... 359/237; 359/240
(58) Field of Classification Search ................. 359/237
See application file for complete search history.

(56) References Cited

U.S. PATENT DOCUMENTS

| 5,796,765 | A | 8/1998 | Lucek et al. | |
|---|---|---|---|---|
| 6,480,318 | B2 * | 11/2002 | Mori et al. | 359/264 |
| 6,741,763 | B1 * | 5/2004 | Taylor | 385/3 |
| 2003/0147116 | A1 * | 8/2003 | Shpantzer et al. | 359/264 |
| 2003/0157905 | A1 * | 8/2003 | Holmqvist | 455/102 |
| 2005/0036525 | A1 * | 2/2005 | Liu | 372/6 |

FOREIGN PATENT DOCUMENTS

JP 63-151211 6/1988

* cited by examiner

Primary Examiner—Jordan M. Schwartz
Assistant Examiner—James C Jones
(74) Attorney, Agent, or Firm—Nixon Peabody LLP

(57) ABSTRACT

A laser pulse generator utilizes an optical modulator to generate wave pulses having customized temporally shaped pulses. A continuous wavelength laser source inserts optical energy into an optical pulse generator, which in turn emits light into an amplification stage. The amplification stage emits light pulses corresponding to user-defined amplitudes and pulse shapes. The optical pulse generator comprises an optical modulator which modulates incoming light in accordance with temporal waveforms defined by an electronic waveform generator.

4 Claims, 5 Drawing Sheets

LASER PULSE GENERATOR

FIELD OF THE INVENTION

The present invention relates to laser pulse generation, and particularly to temporally shaped laser pulses, having a pre-designed shape, including devices and methods for generating the temporal shape.

BACKGROUND OF THE INVENTION

Pulsed lasers (and recently pulsed fiber lasers) that are used in medical, industrial cutting, drilling, welding and heat treating as well as remote sensing applications often use pulses of high power and need temporally shaped pulses in order to optimize their performance. The optimal temporal shape of the pulse is of importance when the processes occurring during the pulse are thermal and the pulse shape determines the temperature distribution in time and space. When the processes induced by the laser are nonlinear, it is of importance to have a "flat top" pulse, to generate the same nonlinear effect during the full pulse length. The generation of temporally shaped pulses has been the subject of research, especially in the area of fusion research and ultra short (femtosecond) pulses, and the solutions require a setup splitting the pulse into sub pulses, manipulating them and recombining them, thus requiring an elaborate optical set up. A new solution is needed to replace the elaborate optical set up and provide the ability to change temporal pulse shapes, repetition rate and power, using software and less elaborate hardware.

SUMMARY OF THE INVENTION

According to some embodiments of the present invention, systems and methods for supplying high power, flexible, reconfigurable temporal laser pulse shaping system for pulse duration of $10^{-10}$ to $10^{-3}$ seconds or in some cases even longer pulses up to continuous operation are provided.

According to some embodiments of the present invention, a flexible, reconfigurable temporal laser pulse shaping system provides pulses that are amplified in an optical bulk or fiber amplifier reaching high powers.

According to further embodiments of the present invention, a flexible, reconfigurable, programmable, software controlled, temporal laser pulse shaping system capable of handling a broad range of wavelengths is provided.

In accordance with the invention, there is therefore provided a flexible, reconfigurable temporal laser pulse shaping system comprising a low power CW laser (fixed or tunable wavelength), followed by a reconfigurable temporal laser pulse shaping system and a dedicated optical bulk or fiber amplifier. Some embodiments of the present invention comprise two elements combined into the same device; the first is a flexible, reconfigurable temporal laser pulse shaper and the second is, e.g., a high gain, diode pumped amplifier, designed to have low noise/ASE (Amplified Spontaneous Emission) emitted in the direction of the beam propagation.

According to some embodiments, the flexible, reconfigurable temporal laser pulse shaper is based on a modulator, (e.g., a Mach-Zehnder (MZ) modulator) which is tuned to a non-common working point, the null state. In this case one can generate any shape of pulses with very high power (after amplification more than 10 dB higher than CW case). The time width of the pulse depends on the modulator's bandwidth. For example, using a 2.5 Gb/s MZ modulator, the time width of the pulses can vary from 500 ps to 100 µs, using other available modulators. For example, using a 40 Gb/s operation enables the temporal shaping of pulses down to about 30 ps. The MZ modulator is electrically fed by an electrical pulse generator. Systems according to the present invention will provide pulses with any customized shape, depending on the pulse generator capability, or bandwidth, which is today commercially available at 40 Gb/s and higher.

According to some embodiments of the present invention, the amplifier amplifies, for example, within the 1500 nm wavelength range. Examples of amplifiers that may be used with the present invention include an EDFA (Erbium Doped Fiber Amplifier), a Raman amplifier, or an SOA (Semiconductor Optical Amplifier). The first two are pumped by diodes and the third is directly pumped by electrical current. These devices work normally for amplifying CW or quasi CW lasers, but in this case are used to amplify pulses, and behave in a different way, as explained below. Special measures are taken to eliminate the ASE (Amplified Spontaneous Emission), which is a disturbing phenomenon, converting part of the inverted population energy into a noise-like radiation at the background level of the pulse.

The system can generate a variety of signals with different amplitude, frequency or pulse rate, rise time, fall time and delay time. The maximum output power of the pulse that can be generated can be more than 10 dB higher than the specification of the amplifier for CW input, due to the accumulation of inverted population at the laser level, in the amplifier.

BRIEF DESCRIPTION OF THE DRAWINGS

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings:

FIG. 1 is a schematic representation of a flexible, reconfigurable temporal laser pulse generating and shaping system;

FIG. 2 is a graphic representation of pulse shapes at various points;

FIG. 3 is a graphic illustration of the null point operation of the MZ modulator;

FIG. 4 is an experimental curve of temporal flat-top rectangular and trapezoidal pulses; and FIG. 5 is an experimental curve of temporal Gaussian pulses.

DETAILED DESCRIPTION OF PREFERRED EMBODIMENTS

Figure 1:
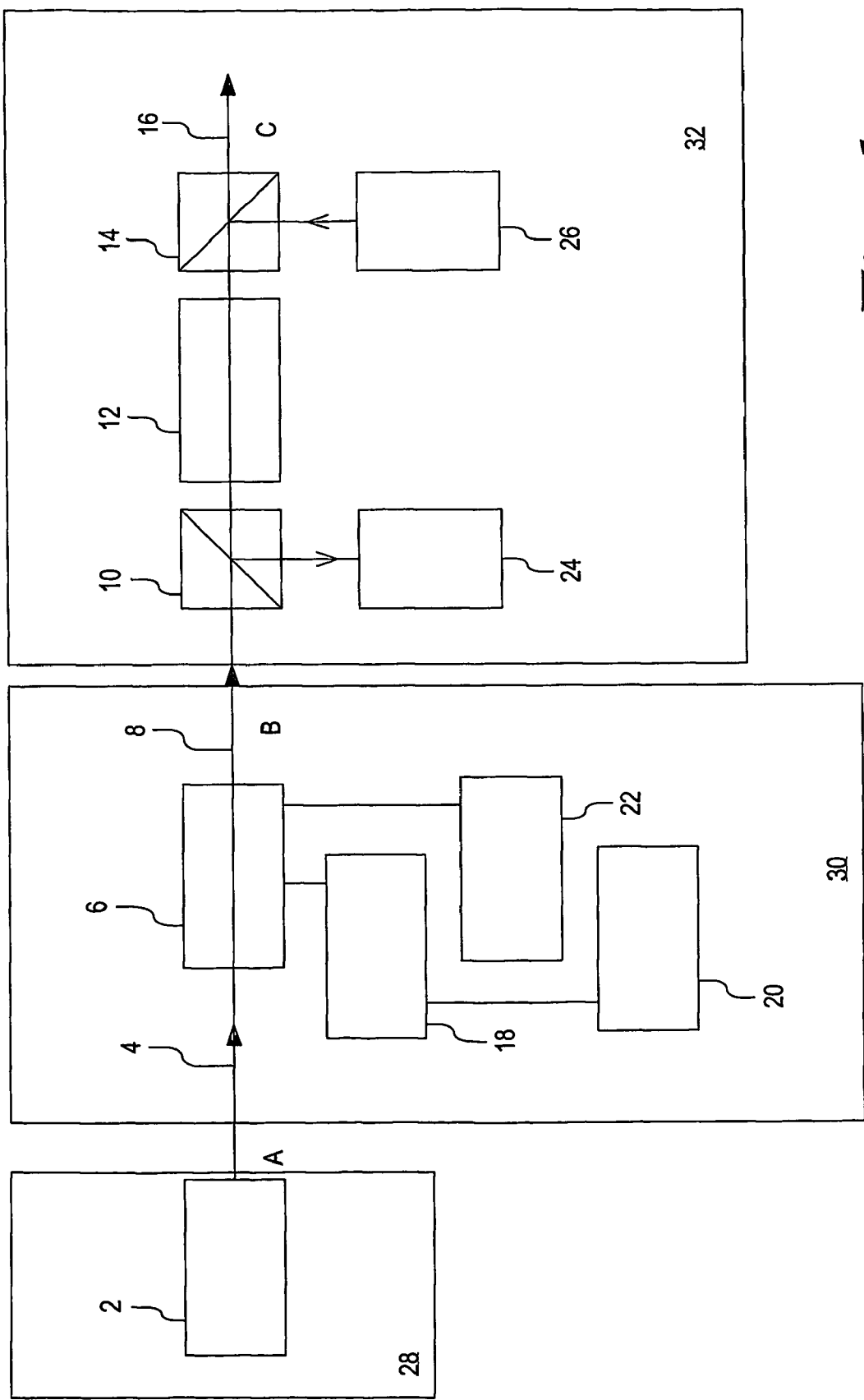

Referring now to FIG. 1, there is shown a schematic representation of a flexible, reconfigurable temporal laser pulse generating and shaping system. The system consists of three major sub systems, namely, the CW laser source 28, the optical pulse generator 30 and the amplification stage 32.

The laser source 28 consists of, e.g., a fixed or tunable wavelength CW diode laser 2 of medium power, emitting polarized or non-polarized radiation into a fiber 4 at exit point A. While a diode laser has been described for use in the embodiment shown in FIG. 1, it is to be understood that other types of laser sources can be used in specific embodiments of the present invention. In turn, the fiber 4 carries the light from the CW diode laser 2 to an optical modulator 6. In the case of polarized light, the fiber 4 will be a PM (Polarization Maintaining) fiber and the modulator will be a polarizing modulator (e.g., the MZ). In the case of non-polarized light, the fiber 4 will be a regular SMF fiber and the modulator will be an absorption modulator. According to some embodiments, the wavelength can be any in the visible, near IR (Infra Red), e.g., 800 nm, 1300 nm or 1500 nm range, and can be, for example, a tunable laser with model number 3105/3106 manufactured by Agility Communications Inc, USA.

The optical pulse generator 30 consists of an optical modulator 6, such as an optical interferometric MZ modulator, fed by polarized laser light through a PM fiber 4 and emitting light through a fiber 8 at point B. The fiber 8 can be PM or non-PM fiber since the polarization is important only for the modulation by the MZ modulator phase. According to one embodiment, a 10 Gb/s MZ modulator is used with a high extinction ratio (>20 dB) having a DC bias option. One example of a suitable modulator is a JDS Uniphase modulator, part no. 21023816, 10 Gb/s Amp. Modulator. A waveform generator 18 feeds the modulator 6 electrically; this arbitrary waveform generator 18 is capable of generating square-waves, sine, triangle, exponential and any desirable waveform. The waveform generator is supported by software to design the arbitrary wave, and could be controlled via, for example, general purpose interface bus (GPIB) and RS232 protocols by a PC (Personal Computer) 20. According to one embodiment of the present invention, 50 MHz square-waves, namely, 100 MHz sampling rate pulses, may be generated using a pulse generator. One example of a pulse generator suitable for use with the present invention is the 8085 Arbitrary Function Generator available from Tabor Electronics of Israel. To prevent or limit the working point of modulators used in the present invention from drifting, and thus changing the shape of a pulse generated by a system according to the present invention, an optional DC bias controller 22 may be used to keep the modulator 6 in the OFF state. The DC bias controller inserts very low modulation voltage into the bias port without affecting the shape of the signal. Such a technique may be used in telecommunication systems, although they use different working points. A DC bias controller that has been used successfully in one embodiment of the present invention is the P/N Micro-MBC-IDC bias controller, which can be purchased from Pine Photonetics, USA. Light exiting the optical pulse generator 30 is guided into an amplification stage 32.

The laser 28 and the optical pulse generator 30 can be combined into one unit of a self (direct) modulated laser, thus replacing the two units.

The amplification stage 32 is optically fed by a fiber 8 at point B through a splitter 10 into an optical amplifier 12. The light exits the amplification stage 32 through a splitter 14 into a fiber 16, exiting at point C. The optical amplifier 12 can be, for example, a diode pumped, fiber amplifier, a SOA or a solid state amplifier. Usually pulse amplifiers are designed to be free of ASE, but this is usually not the case with CW or quasi CW fiber amplifiers, and ASE suppression measures have to be taken. As an example of an ASE suppression means, one can use a very low intensity laser light source 26, having a wavelength inside the amplification range of the amplifier 12, which is homogenously broadened, but not the same as the wavelength of the laser 2, as a source for "cleaning" the spontaneous emission and creating a backward going beam, inserted into the amplifier 12 through the splitter or polarizer 14. The back-propagating beam is dumped at a beam dump 24 through a splitter or polarizer 10.

Figure 2:
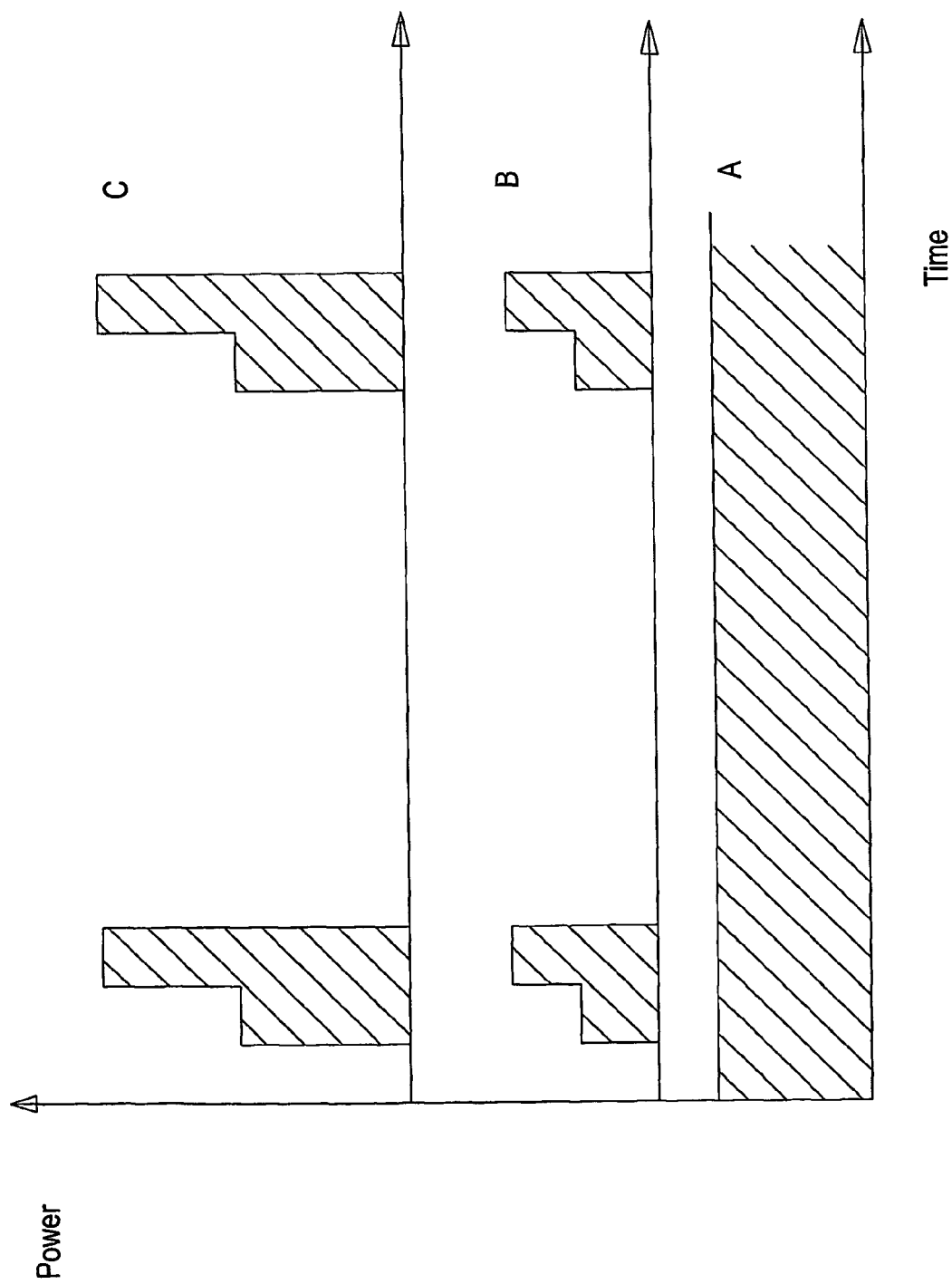

FIG. 2 is a graphic representation of pulse shapes at various points; here A is the CW low power shape at the exit of the laser, at point A of FIG. 1. Curve B shows the modulated light after passing through the fast modulator, where the modulator can assume various shapes, and here only a simple example is given, measured at point B of FIG. 1. Curve C is the amplified version, measured after the amplifier, at point C of FIG. 1.

Figure 3:
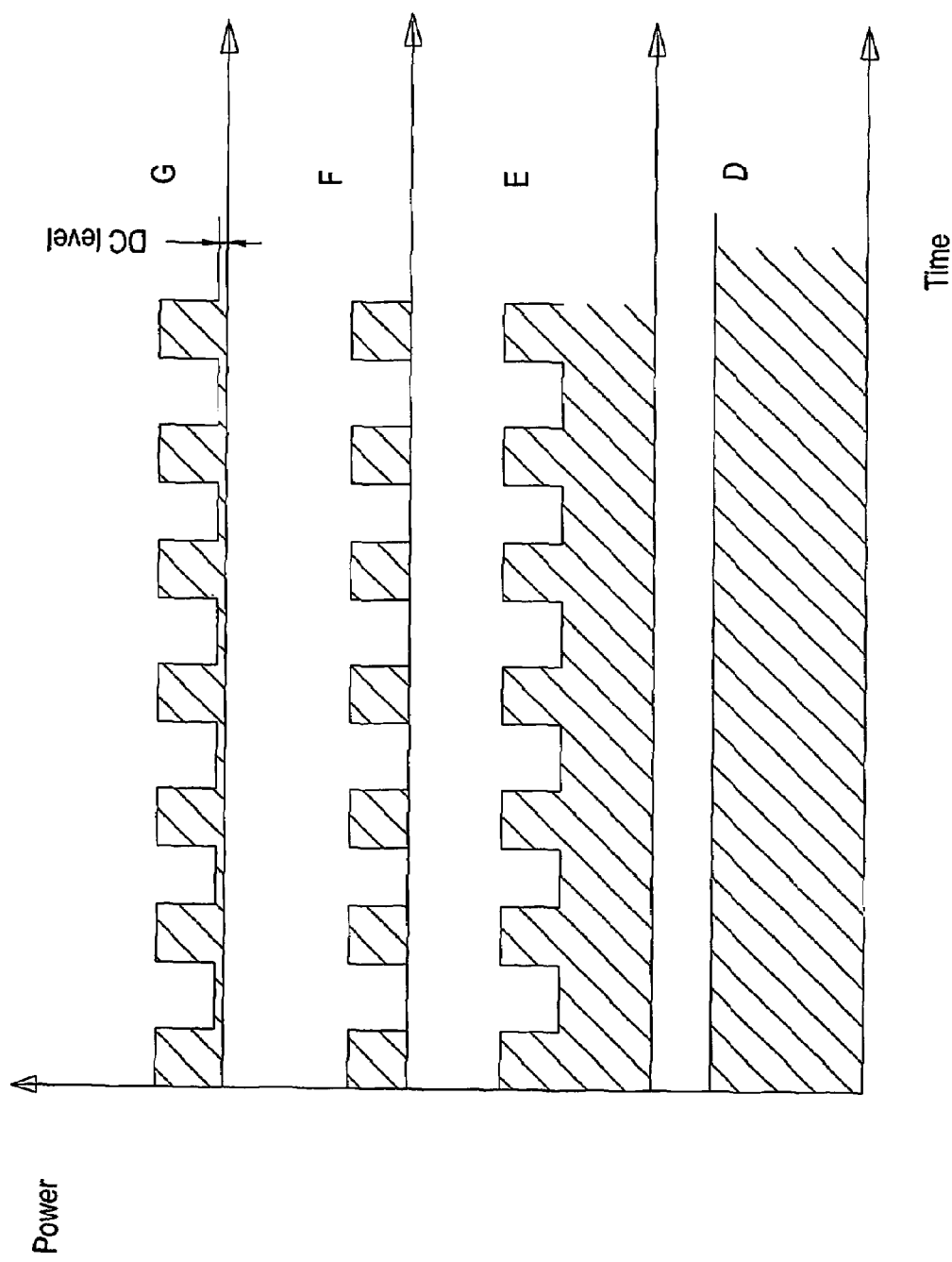

FIG. 3 describes a graphic representation of the null point operation of the MZ modulator. Here, all the curves are measured at point B of FIG. 1, the curve D represents an always open MZ modulator, curve E represents the regular way of modulation, having a large DC level with pulses on its top. Fig F represents the "clean", without DC level pulses, where the DC bias controller is used to shift the operation point of the MZ modulator. Curve G shows (not to scale) the feedback loop control of the DC bias controller, having a small, negligible DC level.

Figure 4:
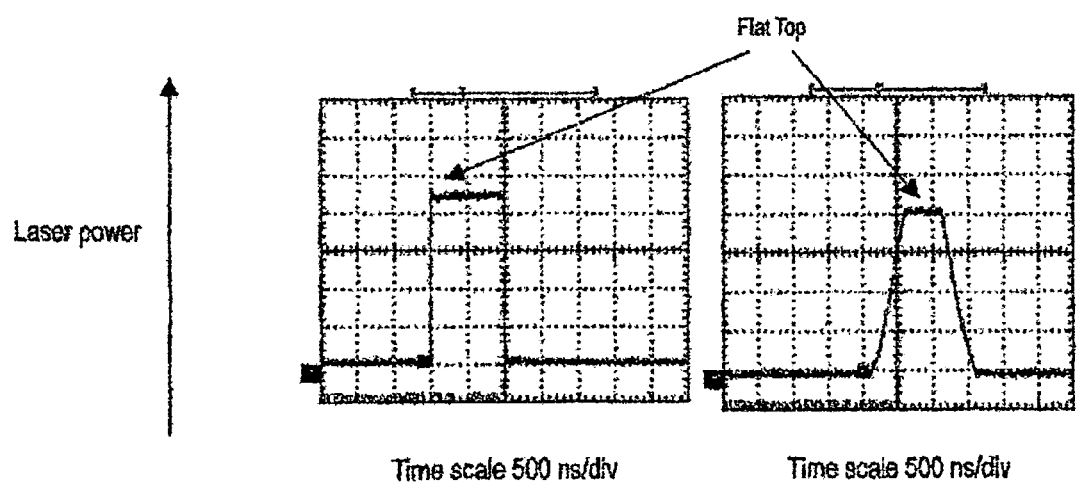

FIG. 4 shows experimental curves of temporal flattop rectangular and trapezoidal pulses generated according to one embodiment of the present invention.

Figure 5:
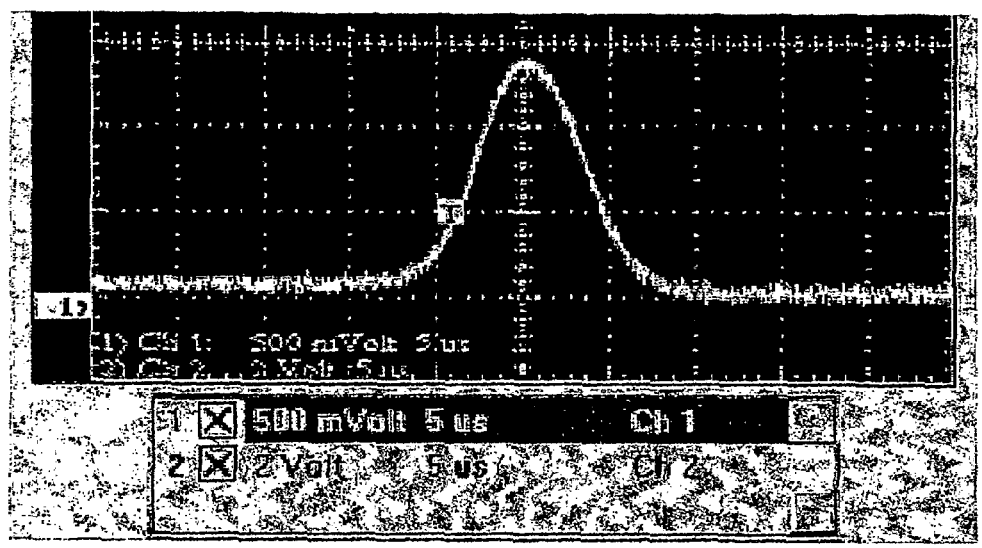

FIG. 5 shows an experimental curve of a temporal Gaussian pulse generated according to one embodiment of the present invention.

Systems and methods according to the present invention may be incorporated into a number of novel uses. For example, a pulsed laser system according to the present invention can be used in a selective range finder having a high signal-to-noise ratio. In this embodiment, a specially-detected pulse shape may be generated by a range finder. This specialized pulse may then be detected by a detector provided on the range-finder, with the range finder ignoring all other pulse shapes.

Further, a pulsed laser system according to the present invention can be used as a selective target designator having a high signal-to-noise ratio. In this embodiment, a specially dedicated pulse shape, such as a square pulse having predetermined pulse characteristics, may be detected by a target-seeking detector. The detector may be programmed to ignore all other pulse shapes, increasing the signal-to-noise ratio of the detection system.

Additionally, pulsed laser systems and methods according to the present invention may be used in efficient and fast-operating friend-or-foe identification systems. In such a system, each member may be given a dedicated temporal pulse shape and/or a dedicated wavelength, identifying the member when the laser is operational. Lasing in such a system may take the form of a question laser pulse, requesting friend-or-foe identification, or of an answer laser pulse, responding to a friend-or-foe identification request.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims.

What is claimed is:

1. A laser pulse generator comprising:
   a laser source emitting an initial laser output,
   an optical modulator accepting said initial laser output and modifying an initial waveform of said initial laser output using input from a waveform generator in communication with said optical modulator, said optical modulator being tuned to a non-common working point, the null state, and modulating the intensity and temporal shape of said initial laser output to emit a modulated laser output having a waveform different from the waveform of said initial laser output, and an amplification stage operating in a non-linear region and accepting said modulated laser output and emitting amplified modulated laser light.

2. A laser pulse generator comprising:

a laser source emitting an initial laser output, an optical modulator accepting said initial laser output and modifying an initial waveform of said initial laser output using input from a waveform generator in communication with said optical modulator, said optical modulator being tuned to a non-common working point, the null state, and modulating the intensity and temporal shape of said initial laser output to emit a modulated laser output having a waveform different from the waveform of said initial laser output, and a control module for controlling said waveform generator and determining the waveform of said modulated laser output.

3. The laser pulse generator of claim 2 wherein said control module is a personal computer.

4. The laser pulse generator of claim 1 wherein said amplification stage comprises amplified spontaneous emission suppression means including a low-intensity emission suppression laser light source for cleaning the amplified spontaneous emission using a backward-going beam.

* * * * *

UNITED STATES PATENT AND TRADEMARK OFFICE
CERTIFICATE OF CORRECTION

PATENT NO. : 7,557,977 B2 Page 1 of 1
APPLICATION NO. : 10/558988
DATED : July 7, 2009
INVENTOR(S) : Ram Oron et al.

It is certified that error appears in the above-identified patent and that said Letters Patent is hereby corrected as shown below:

On the TITLE PAGE:

Add after field (76):

-- Assignee

KiloLambda Technologies, Ltd.
Tel-Aviv, Israel --

Signed and Sealed this

Fifth Day of January, 2010

David J. Kappos
*Director of the United States Patent and Trademark Office*